United States Patent
Hollander et al.

(10) Patent No.: US 7,284,177 B2
(45) Date of Patent: Oct. 16, 2007

(54) METHOD AND APPARATUS FOR FUNCTIONALLY VERIFYING A PHYSICAL DEVICE UNDER TEST

(75) Inventors: Yoav Z. Hollander, Qiriat Ono (IL); Yaron E. Kashai, Sunnyvale, CA (US)

(73) Assignee: Verisity, Ltd., Mountain View, CA (US)

( * ) Notice: Subject to any disclaimer, the term of this patent is extended or adjusted under 35 U.S.C. 154(b) by 285 days.

(21) Appl. No.: 11/095,226

(22) Filed: Mar. 31, 2005

(65) Prior Publication Data

US 2006/0242525 A1    Oct. 26, 2006

(51) Int. Cl.
   *G01R 31/28* (2006.01)
(52) U.S. Cl. ...................... 714/739; 714/741
(58) Field of Classification Search .............. 716/4; 714/33, 724, 739, 741; 703/15; 702/120; 382/181; 712/120
   See application file for complete search history.

(56) References Cited

U.S. PATENT DOCUMENTS

| | | | |
|---|---|---|---|
| 5,400,263 A * | 3/1995 | Rohrbaugh et al. ............ 716/4 |
| 5,859,962 A * | 1/1999 | Tipon et al. .................. 714/33 |
| 5,933,356 A * | 8/1999 | Rostoker et al. .............. 703/15 |
| 6,182,258 B1 | 1/2001 | Hollander | |
| 6,226,716 B1 * | 5/2001 | Bauman et al. ............. 711/145 |
| 6,367,041 B1 * | 4/2002 | Statovici et al. ............ 714/724 |
| 6,480,800 B1 * | 11/2002 | Molyneaux et al. ........ 702/120 |
| 6,591,213 B1 | 7/2003 | Burlison | |
| 6,675,138 B1 | 1/2004 | Hollander et al. | |
| 6,751,351 B2 * | 6/2004 | Knowles et al. ............ 382/181 |
| 2002/0073375 A1 | 6/2002 | Hollander | |
| 2002/0093356 A1 | 7/2002 | Williams et al. | |
| 2004/0216023 A1 | 10/2004 | Maoz et al. | |

\* cited by examiner

*Primary Examiner*—David Ton
(74) *Attorney, Agent, or Firm*—Moser IP Law Group

(57) ABSTRACT

Method, apparatus, and computer readable medium for functionally verifying a physical device under test (DUT) is described. In one example, verification test data is generated for the physical DUT using a constraint-based random test generation process. For example, the architecture, structure, and/or content of the verification test data may be defined in response to constraint data and an input/output data model. A first portion of the verification test data is applied to the physical DUT. Output data is captured from the physical DUT in response to application of the first portion of the verification test data. A second portion of the verification test data is selected in response to the output data. Expected output data for the physical DUT associated with the verification test data may be generated and compared with the output data captured from the DUT to functionally verify the design of the DUT.

20 Claims, 4 Drawing Sheets

METHOD AND APPARATUS FOR FUNCTIONALLY VERIFYING A PHYSICAL DEVICE UNDER TEST

BACKGROUND OF THE INVENTION

1. Field of the Invention

The present invention generally relates to verifying circuit designs and, more particularly, to functionally verifying a physical device under test.

2. Description of the Related Art

The field of electronic design automation (EDA) is well established. A number of software tools are used to describe a circuit at various levels of granularity or specificity. Such tools include gate level descriptions, which specify the circuit in very great detail, to high level descriptions written in hardware description languages (HDLs), such as VERILOG or VHDL. Design verification is the process of determining whether an integrated circuit, board, or system-level architecture, exactly implements the requirements defined by the specification of the architecture for that device. As designs become more complex, the likelihood of design errors increases and design verification becomes increasingly difficult and time consuming.

Presently, design verification for a device under test (DUT) is performed on a simulation model of the device. A conventional process of verifying a design through a simulation model of the device is aided by the availability of HDLs. The resultant simulated model of the device receives input stimuli in the form of test vectors, which may be a string of binary digits applied to the input of a circuit. The simulated model then produces results, which are checked against expected results for the particular design of the device. Since HDLs are typically not designed for actual verification, a verification engineer must write additional programming code to interface with the models described by these HDLs in order to perform design verification of the device.

In some cases, it is desirable to perform design verification on an actual, physical device (e.g., an integrated circuit). Verification of an actual device should not be confused with testing an actual device. Devices are conventionally tested after being manufactured to determine whether they are operative. As discussed above, design verification is the process of checking that a design functions according to the specification of the design. Verifying an actual device is more complex than verifying a simulation model of the device. Notably, the actual device runs many orders of magnitude faster than a simulation model of the device (e.g., on the order of a million times faster). Thus, the application of test vectors and analysis of the results becomes nontrivial. In addition, it is difficult and impractical to monitor the internal nodes of a design in the actual device, whereas such internal nodes are accessible in a simulation model.

Accordingly, there exists a need in the art for a method and apparatus for functionally verifying a physical device under test.

SUMMARY OF THE INVENTION

Method, apparatus, and computer readable medium for functionally verifying a physical device under test (DUT) is described. In one embodiment, verification test data is generated for the physical DUT using a constraint-based random test generation process. For example, the architecture, structure, and/or content of the verification test data may be defined in response to constraint data and an input/output data model. Such constraint data and input/output data model may be defined using a verification specific object oriented programming language. A first portion of the verification test data is applied to the physical DUT. Output data is captured from the physical DUT in response to application of the first portion of the verification test data. A second portion of the verification test data is selected in response to the output data. Expected output data for the physical DUT associated with the verification test data may be generated and compared with the output data captured from the DUT to functionally verify the design of the DUT.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE INVENTION

Figure 1:
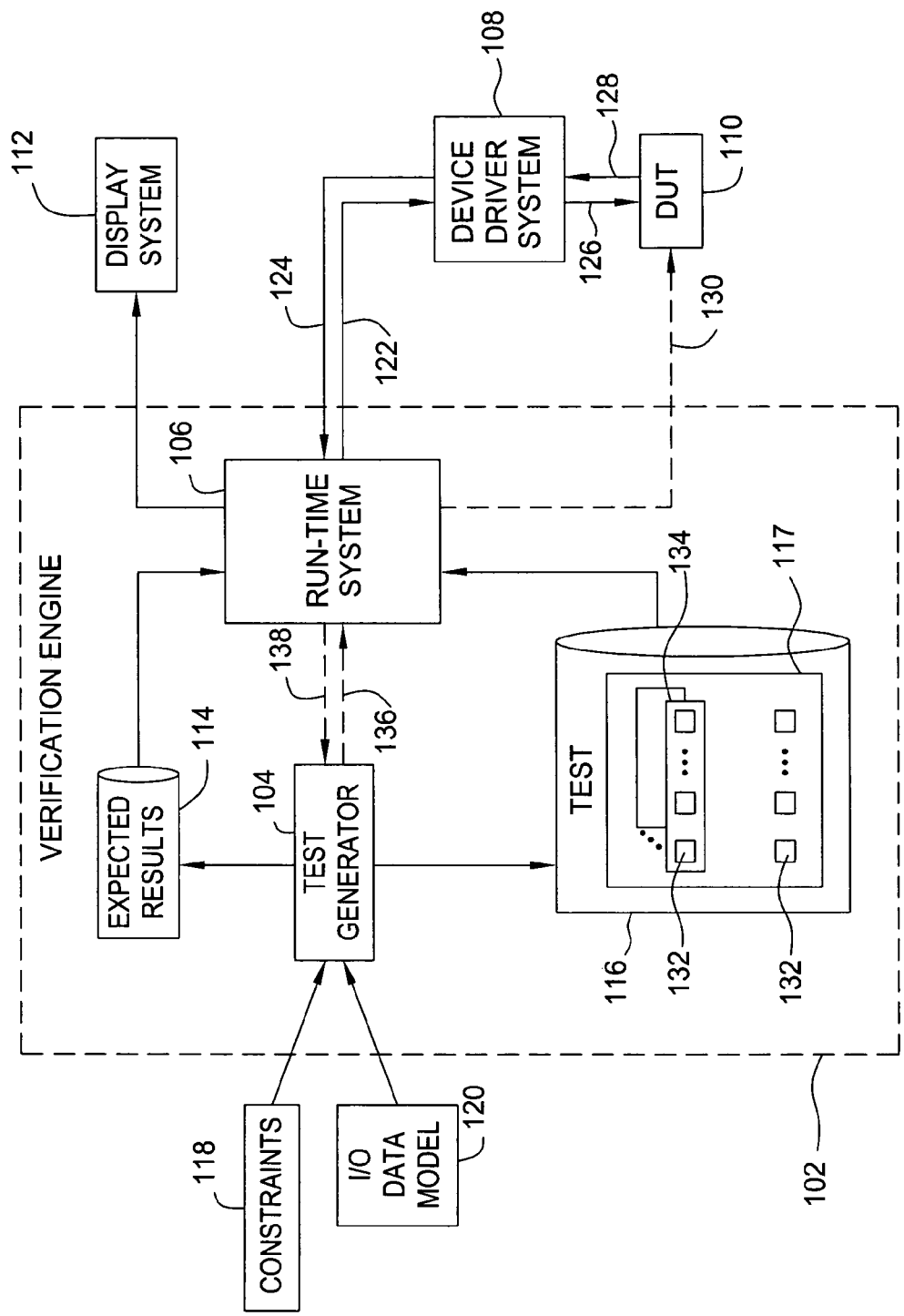
FIG. 1 is a block diagram depicting an exemplary embodiment of a system for functionally verifying a physical device under test (DUT) in accordance with the invention.

FIG. 1 is a block diagram depicting an exemplary embodiment of a system 100 for functionally verifying a physical device under test (DUT) in accordance with the invention. The system 100 includes a verification engine 102, a device driver system 108, a display system 112, and a DUT 110. The verification engine 102 generates data to verify that the DUT 110 functions in accordance with its specification (referred to herein as "verification test data"). The verification engine 102 tests the DUT 110 by interfacing with the device driver system 108 to apply the verification test data to the DUT 110. The DUT 110 processes the verification test data and produces verification test output data, which is provided to the verification engine 102 via the device driver system 108. The verification engine 102 compares the verification test output data to expected output data and reports the results to the display system 112 for display to a user, such as a verification engineer.

In particular, the verification engine 102 includes a test generator 104 and a run-time system 106. The test generator 104 receives constraint data 118 and an input/output (I/O) data model 120. The test generator 104 creates verification test data in response to the constraint data 118 and the I/O data model 120. The I/O data model 120 includes an architectural description of the I/O interface of the DUT 110.

The constraint data 118 includes one or more constraints for restricting the functional scope of the verification test data generated by the test generator 104. Together, the I/O data model 120 and the constraint data 118 provide the architectural requirements and specific restrictions for the structure and content of the verification test data. The test generator 104 also generates expected output data for the verification test data (i.e., the data that is expected to be output by the DUT 110 after application of the verification test data).

For example, the DUT 110 may comprise a network processor or like type device for processing Ethernet traffic. A description of the I/O architecture of the device is provided by the I/O data model 120 (e.g., the number I/O ports configured to process data). The constraint data 118 is configured to constrain the structure of the verification test data (e.g., Ethernet frames) and the content of the verification test data (e.g., header and payload of the frames). The test generator 104 generates Ethernet traffic for functionally verifying the DUT 110 in accordance with the I/O data model 120 and the constraint data 118.

In one embodiment, the verification test data includes a suite of specific verification test patterns to be applied to the DUT 110 to test the functionality thereof. The test generator 104 produces verification test patterns using a constraint-based random test generation process. Notably, the verification test patterns are randomly generated within the boundaries set forth by the I/O data model 120 and the constraint data 118. A single verification test pattern may be generated to elicit verification test output data from the DUT 110. Alternatively, a plurality of verification test patterns may be arranged sequentially to form a verification test pattern sequence. Verification test output data is obtained from the DUT 110 only after the complete verification test pattern sequence has been applied.

The test generator 104 can be constrained to generate verification test patterns for specific subsets of the functionality of the DUT 110. Thus, some verification test patterns can focus on a specific feature in the design of the DUT 110, which other verification test patterns can address broader functional scopes. For a more detailed understanding of a constraint-based random test generation process, the reader is referred to commonly-assigned U.S. Pat. No. 6,182,258, issued Jan. 30, 2001, which is incorporated by reference herein in its entirety.

The constraints 118 and the I/O data model 120 may be constructed using e code, which is the code language provided by the SPECMAN functional programming environment developed by Verisity Ltd. in Israel and available through Verisity Design, Inc. of Mountain View, Calif. The e code language is a hardware-oriented verification specific object-oriented programming language. Objects in this language are instances of "structs", which contain a field and one or more functions or methods that operate on data stored within the field and interface with other objects. Constraints are declared in the context of a struct, and are used to impose constraints on the values generated for the fields of the struct. The constraint-based random test generation process employed by the test generator 104 fills the fields of the structs with random values. For a more detailed understanding of the e code language, the reader is referred to U.S. Pat. No. 6,182,258, referenced above.

The verification engine 102 provides the generated verification test data for application to the DUT 110 via the run-time system 106. Notably, in some embodiments, the verification test data can be processed by the physical DUT 110 many orders of magnitude faster than it can be generated by the test generator 104. In such cases, the verification engine 102 of the invention advantageously bridges the speed difference between the generation of the verification data and the processing of such data by the physical DUT 110.

In particular, in one embodiment of the invention, the test generator 104 pre-computes the verification test data, which is stored in a database 116. The database 116 may store a suite 117 of verification test patterns 132. As described above, a plurality of the test patterns 132 may be grouped to form a sequence 134. The suite 117 may include one or more of such sequences 134. The test generator 104 also generates expected verification test output data, which is stored in the database 114. After the suite 117 is generated and stored in the database 116, the run-time system 106 controls the selection of verification test patterns 132 and/or sequences 134 for application to the DUT 110. By pre-computing the verification data, the speed difference between the test generation process and processing of the DUT 110 is bridged. The run-time system 106 provides the selected verification test patterns 132 and/or sequences 134 to the device driver system 108 via the path 122.

The device driver system 108 is configured to provide an interface between the run-time system 106 and the DUT 110 and to control application of verification test data to the DUT 110. For example, the device driver system 108 may comprise various types of automatic test equipment (ATE) known in the art. Alternatively, the device driver system 108 may comprise more intelligent driver systems designed for testing particular devices. For example, if the DUT 110 is a network processor or the like for processing Ethernet traffic, the device driver system 108 may comprise an Ethernet traffic generator. The device driver system 108 physically applies the verification test data to the DUT 110 via path 126. The DUT 110 processes the verification test data and produces output data. The device driver system 108 collects the output data via path 128. The device driver system 108 then provides the output data to the run-time system 106 via path 124.

The run-time system 106 may also provide control information to the DUT 110 directly via control path 130. For example, the DUT 110 may be a video processor such the verification test data is a stream including a large portion of video data with intermittent control data. The run-time system 106 may apply the infrequently occurring control data portion of the stream to the DUT 110 directly via the path 130. The video portion of the stream is applied to the DUT 110 using the device driver system 108. The control information also may be pre-computed by the test generator 104. Alternatively, since the control information occurs infrequently, the test generator 104 generate such control information "on-the-fly" as the DUT 110 is processing the bulk of the verification test data.

The run-time system 106 compares the output data produced by the DUT 110 with expected output data stored in the database 114. The run-time system 106 may report the results of the comparison to the display system 112. The display system 112 is configured to display the results to a user, such as a verification engineer. For example, the display system 112 may display the results to the user using a graphical user interface (GUI). In addition, upon receiving the output data produced by the DUT 110, the run-time system 106 may controllably select additional verification test patterns 132 and/or sequences 134 for application to the DUT 110. The additional verification test data is then applied to the DUT 110, additional output data is returned and compared with the expected output data, and the results are reported to the display system 112. This process may be repeated to apply various verification test patterns and/or verification test pattern sequences to the DUT 110 for functional verification of the design.

In another embodiment of the invention, the test generator 104 generates the verification test data in real-time while data is being processed by the DUT 110. For example, the test generator 104 may provide verification test data to the run-time system 106 via a path 136. In particular, the test generator 104 generates verification test data, which is then "expanded" by the run-time system 106 to compensate for the rate difference between test generation and processing of tests by the DUT 110. For example, the run-time system 106 may be configured to repeat a generated test pattern or a sequence of test patterns in a loop until a new test pattern(s) is generated by the test generator 104. Alternatively, the run-time system 106 may be configured to provide a pre-defined pattern or sequence (e.g., an idle pattern) to the DUT 110 while the test generator 104 generates new test pattern(s). In yet another alternative, the run-time system 106 may be configured to apply one or more pre-defined perturbations of a previously generated test pattern of sequence of test patterns while new test pattern(s) are being generated by the test generator 104. In this manner, verification test data is continuously being applied to the DUT 110, while the test generator 104 has time to generate new test patterns.

In another embodiment of the invention, the test generator 104 may comprise a plurality of generators for producing the verification test data in parallel. For example, the test generator 104 may be implemented using a plurality of computers operating in parallel. In such an embodiment, the test generator 104 may be configured with enough parallel test generation processes such that the verification test data may be applied to the DUT 110 in real-time, without the use of the rate-matching techniques discussed above. That is, the test generator 104 may be configured with sufficient parallel test generation processes such that verification test data is produced at a rate similar to the rate that the DUT 110 processes the data.

In another embodiment of the invention, the device driver system 108 may be a programmable generator that is programmed to generate particular test patterns using a command set. For example, the device driver system 108 may comprise an Ethernet traffic generator configured to generate Ethernet traffic patterns based on specific input commands. Thus, instead of generating test patterns, the test generator 104 may generate commands for controlling the device driver system 108, which are coupled to the device driver system 108 through the run-time system 106. The test generator 104 may pre-generate a set of commands for controlling the device driver system 108. Alternatively, the test generator 104 may generate commands on-the-fly as the device driver system 108 is applying test patterns to the DUT 110. In other words, the rate matching techniques discussed above (e.g., looping test patters, using an idle test pattern, using test pattern perturbations) are implemented by the device driver system 108 while the test generator 104 generates commands to control the device driver system 108.

Figure 2:
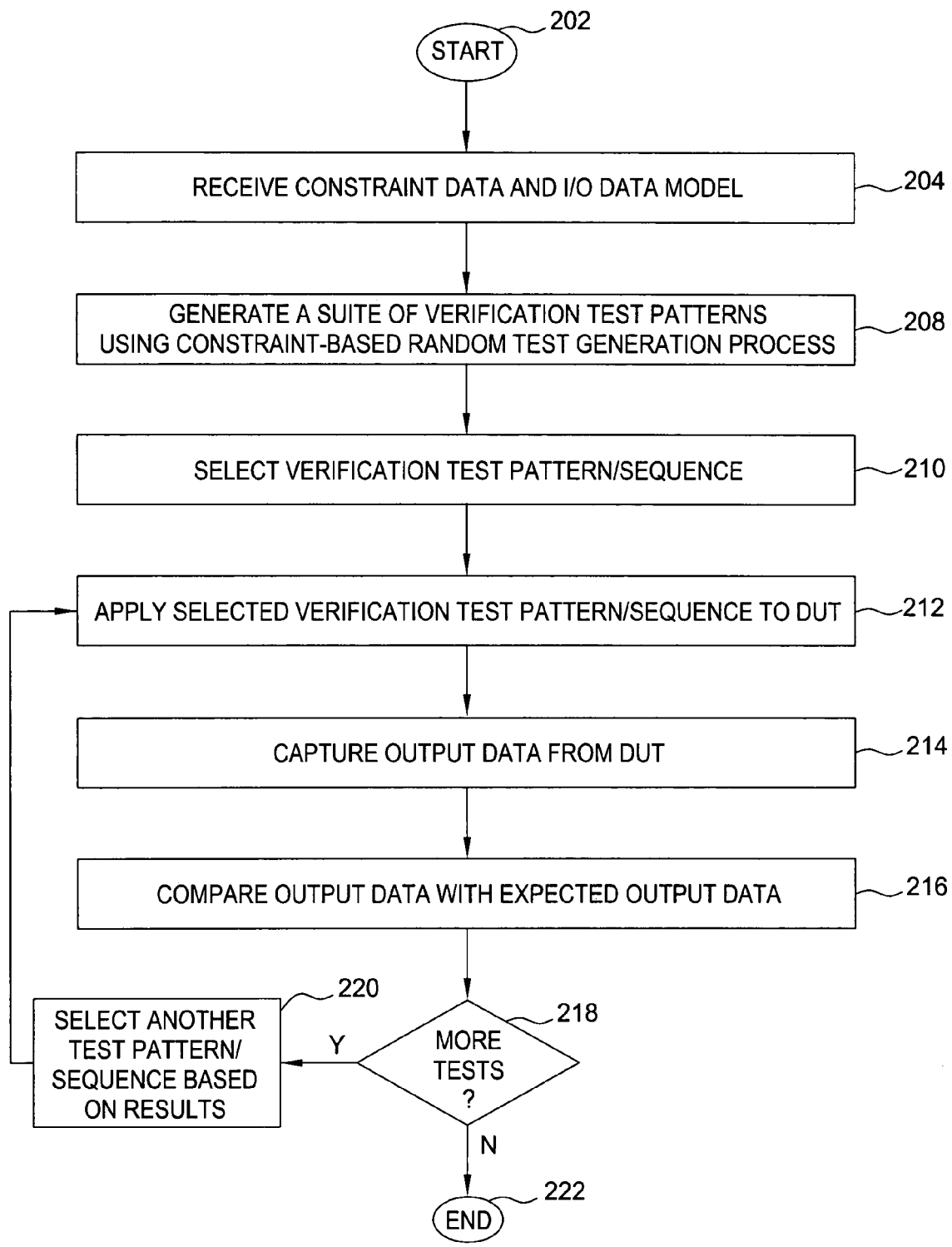
FIG. 2 is a flow diagram depicting an exemplary embodiment of a method of functionally verifying a physical DUT in accordance with the invention.

FIG. 2 is a flow diagram depicting an exemplary embodiment of a method 200 of functionally verifying a physical DUT in accordance with the invention. The method 200 begins at step 202. At step 204, constraint data and an I/O data model for the DUT are received. In one embodiment, the constraint data and I/O data model may be constructed using e code as discussed above. At step 208, a suite of verification test patterns is generated using a constraint-based random test generation process. The verification test pattern suite may include one or more verification test patterns and/or one or more verification test pattern sequences to be applied to the DUT for functional verification.

At step 210, a verification test pattern or verification test pattern sequence is selected. At step 212, the selected test pattern/sequence is applied to the DUT. At step 214, output data produced by the DUT in response to the applied test pattern/sequence is captured. At step 216, the captured output data is compared with expected output data associated with the selected test pattern/sequence. At step 218, a determination is made as to whether more verification test patterns/sequences are to be applied. If not, the method 200 ends at step 222. Otherwise, the method 200 proceeds to step 220, where another verification test pattern or verification test pattern sequence is selected. For example, additional verification test patterns/sequences may be selected based on the output data captured from the DUT. The method 200 then returns to step 212.

Figure 3:
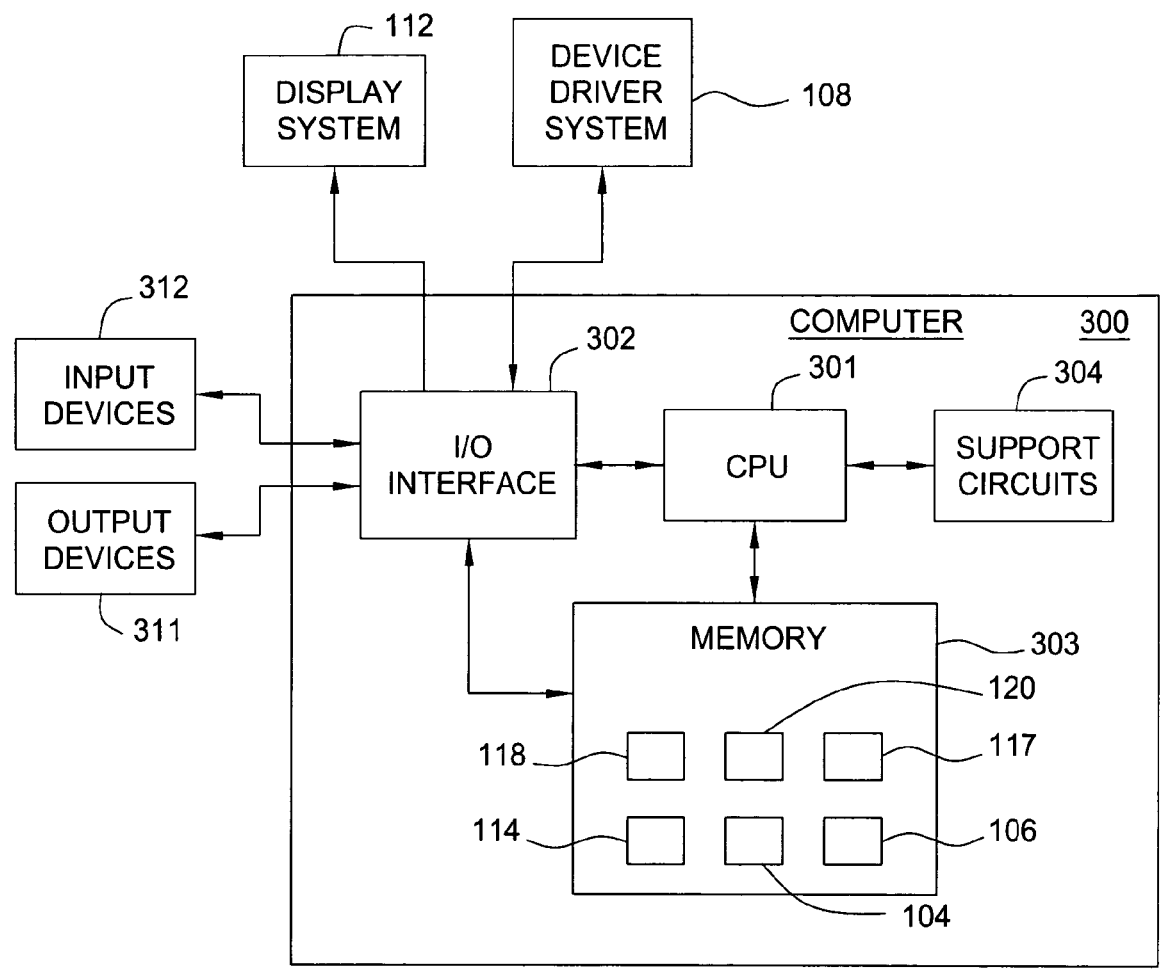
FIG. 3 is a block diagram depicting an exemplary embodiment of a computer suitable for implementing the processes, methods, and systems described herein.

FIG. 3 is a block diagram depicting an exemplary embodiment of a computer 300 suitable for implementing the processes, methods, and systems described herein. Elements that are the same or similar to those of FIG. 1 are designated with identical reference numerals and are described in detail above. For example, the computer 300 may be used to implement the verification engine 102 of FIG. 1. The computer 300 includes a central processing unit (CPU) 301, a memory 303, various support circuits 304, and an I/O interface 302. The CPU 301 may be any type of microprocessor known in the art. The support circuits 304 for the CPU 301 include conventional cache, power supplies, clock circuits, data registers, I/O interfaces, and the like. The I/O interface 302 may be directly coupled to the memory 303 or coupled through the CPU 301. The I/O interface 302 may be coupled to various input devices 312 and output devices 311, such as a conventional keyboard, mouse, printer, display, and the like. The I/O interface 302 is also coupled to the device driver system 108 and the display system 112.

The memory 303 may store all or portions of one or more programs and/or data to implement the processes, methods, and systems described herein. Notably, the memory 303 may store the constraint data 118, the I/O data model 120, the verification test suite 117, and the expected output data 114. The memory 303 may store one or more programs to implement the test generator 104 and the run-time system 106. The computer 300 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 303. The memory 303 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

For purposes of clarity by example, one or more aspects of the invention are disclosed as being implemented as a computer executing a software program. It is to be understood that the invention may be implemented in hardware, software, or a combination of hardware and software. Such implementations may include a number of processors independently executing various programs and dedicated hardware, such as ASICs. Notably, the functional components depicted in FIG. 1 may be part of an emulation system, ATE, or other type of special purpose test equipment.

Figure 4:
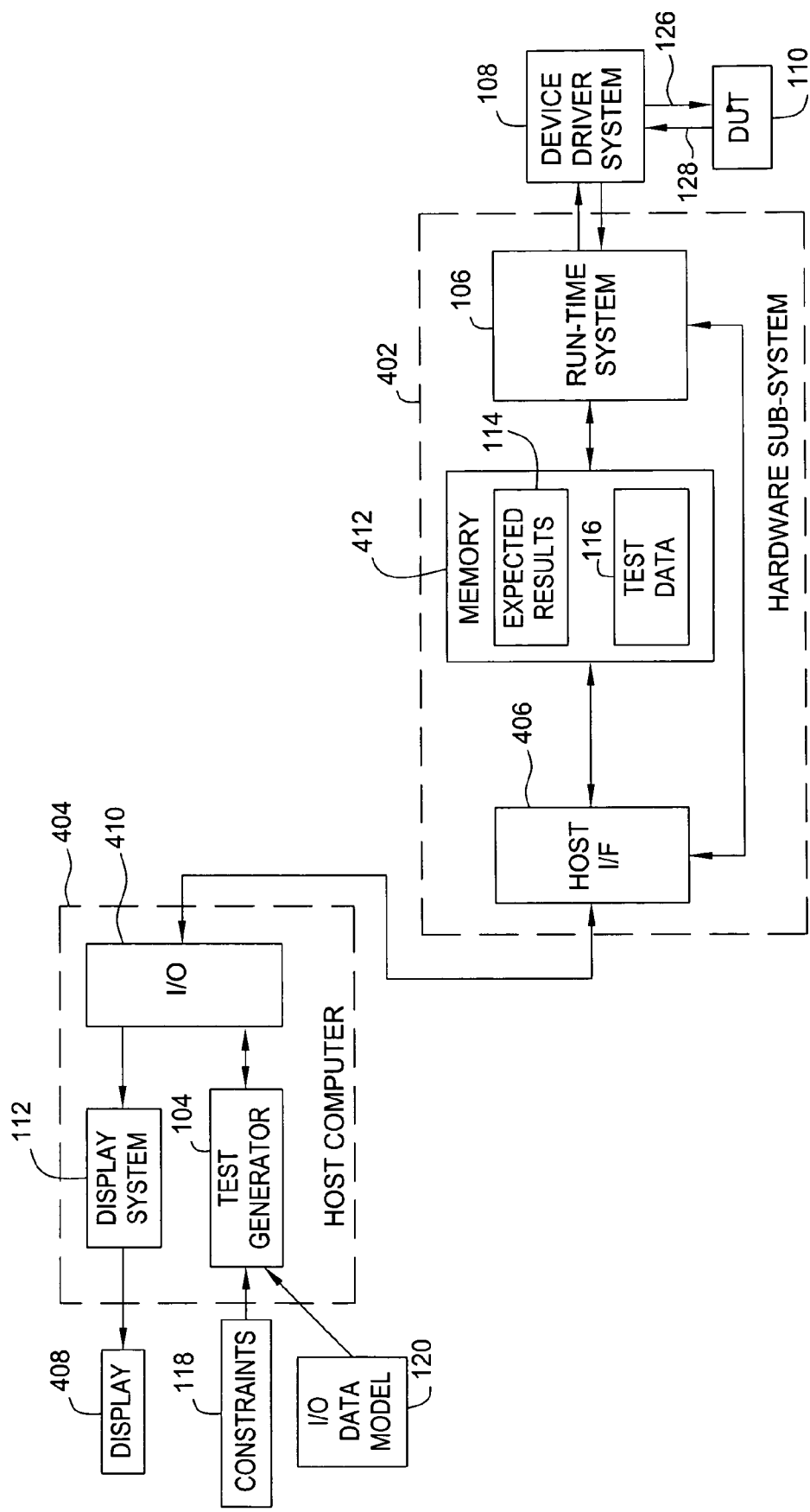
FIG. 4 is a block diagram depicting another exemplary embodiment of a system for functionally verifying a DUT in accordance with the invention.

In particular, FIG. 4 is a block diagram depicting another exemplary embodiment of a system 400 for functionally verifying a DUT in accordance with the invention. Elements of FIG. 4 that are the same or similar to those of FIG. 1 are designated with identical reference numerals and are described in detail above. The system 400 includes a host computer 404 and a hardware sub-system 402. The host computer 404 includes an I/O interface 410, the display system 112, the test generator 104, and a display 408. The display system 112 is coupled to the display 408 for displaying test results to a user. The I/O interface 410 is coupled to the display system 112 and the test generator 104. The test generator 104 may be implemented using software, as described above with respect to FIG. 3.

The hardware sub-system 402 includes a host interface 406, memory 412, and the runtime system 106. The host interface 406 is coupled to the I/O interface 410 of the host computer 404 for receiving verification test data and expected result data generated by the test generator 104, and for providing test result data to the host computer 404 for display on the display 408. The expected result data 114 and the verification test data 116 are stored in the memory 412. The runtime system 106 is in communication with the host interface 406 and the memory 412. The runtime system 106 operates substantially as described above to apply verification test data to the DUT 110 through the device driver system 108, and receive test result data in response thereto. The hardware sub-system 402 then provides the test result data to the host computer 404.

While the foregoing is directed to embodiments of the present invention, other and further embodiments of the invention may be devised without departing from the basic scope thereof, and the scope thereof is determined by the claims that follow.

The invention claimed is:

1. A method of functionally verifying a physical device under test (DUT), comprising:
   generating verification test data for said physical DUT using a constraint-based random test generation process;
   applying a first portion of said verification test data to said physical DUT;
   capturing output data from said physical DUT in response to application of said first portion of said verification test data; and
   selecting a second portion of said verification test data in response to said output data.

2. The method of claim 1, further comprising:
   applying said second portion of said verification test data to said physical DUT.

3. The method of claim 1, wherein said step of generating comprises:
   receiving constraint data;
   receiving an input/output data model associated with said physical DUT;
   defining at least one of architecture, structure, and content of said verification test data in response to said constraint data and said input/output data model.

4. The method of claim 3, wherein said constraint data and said input/output data model are defined using a verification specific object oriented programming language.

5. The method of claim 1, further comprising:
   generating expected output data for said physical DUT associated with said verification test data.

6. The method of claim 5, further comprising:
   comparing said output data with said expected output data to produce results; and
   displaying said results.

7. The method of claim 1, wherein said verification test data comprises at least one of: a plurality of verification test patterns and a plurality of verification test pattern sequences.

8. Apparatus for functionally verifying a physical device under test (DUT) coupled to a device driver system, comprising:
   a test generator configured to generate verification test data for said physical DUT using a constraint-based random test generation process; and
   a run-time system configured to receive output data produced by said DUT from said device driver system and to selectively provide at least a portion of said verification test data to said device driver system for application to said DUT in response to said output data.

9. The apparatus of claim 8, wherein said test generator is configured to receive constraint data and an input/output data model and to define at least one of architecture, structure, and content of said verification test data in response to said constraint data and said input/output data model.

10. The apparatus of claim 8, wherein said constraint data and said input/output data model are defined using a verification specific object oriented programming language.

11. The apparatus of claim 8, further comprising:
    a memory for storing said verification test data;
    wherein said run-time system is configured to access said memory to obtain said at least a portion of said verification test data.

12. The apparatus of claim 8, wherein said test generator is further configured to generate expected output data for said DUT associated with said verification test data, and wherein said run-time system is configured to compare said output data with said expected output data.

13. The apparatus of claim 8, wherein said verification test data comprises at least one of: a plurality of verification test patterns and a plurality of verification test pattern sequences.

14. A computer readable medium having stored thereon instructions that, when executed by a computer, causes the computer to perform a method of functionally verifying a physical device under test (DUT), comprising:
    generating verification test data for said physical DUT using a constraint-based random test generation process;
    providing a first portion of said verification test data for application to said physical DUT;

receiving output data from said physical DUT in response to application of said first portion of said verification test data; and selecting a second portion of said verification test data in response to said output data.

15. The computer readable medium of claim 14, further comprising:

providing said second portion of said verification test data for application to said physical DUT.

16. The computer readable medium of claim 14, wherein said step of generating comprises:

receiving constraint data;

receiving an input/output data model associated with said physical DUT;

defining at least one of architecture, structure, and content of said verification test data in response to said constraint data and said input/output data model.

17. The computer readable medium of claim 16, wherein said constraint data and said input/output data model are defined using a verification specific object oriented programming language.

18. The computer readable medium of claim 14, further comprising:

generating expected output data for said physical DUT associated with said verification test data.

19. The computer readable medium of claim 18, further comprising:

comparing said output data with said expected output data to produce results; and providing said results for display.

20. The computer readable medium of claim 14, wherein said verification test data comprises at least one of: a plurality of verification test patterns and a plurality of verification test pattern sequences.

* * * * *